United States Patent [19]

Doornveld

[11] Patent Number: 4,668,334
[45] Date of Patent: May 26, 1987

[54] METHOD AND APPARATUS FOR APPLYING A LAYER OF PHOTOSENSITIVE MATERIAL TO A SEMICONDUCTOR WAFER

[75] Inventor: Herman E. Doornveld, Mettmenstetten, Switzerland

[73] Assignee: U.S. Philips Corporation, New York, N.Y.

[21] Appl. No.: 795,684

[22] Filed: Nov. 6, 1985

[30] Foreign Application Priority Data

Nov. 13, 1984 [NL] Netherlands .......................... 8403459

[51] Int. Cl.⁴ ........................ B44C 1/22; C03C 15/00; B29C 37/00; B05C 11/12
[52] U.S. Cl. ..................................... 156/640; 118/52; 156/345; 156/655; 156/668; 427/240
[58] Field of Search .............. 152/345, 655, 640, 662, 152/668, 639; 427/240; 118/52

[56] References Cited

U.S. PATENT DOCUMENTS 3,041,225  6/1962  Emeis ................................. 156/640
4,075,044  2/1978  Sager et al. ..................... 156/626 X
4,557,785  12/1985 Ohkuma ......................... 156/639 X

FOREIGN PATENT DOCUMENTS 1214972  4/1966  Fed. Rep. of Germany ...... 156/640
0146137  11/1981 Japan .................................. 156/640

Primary Examiner—William A. Powell
Attorney, Agent, or Firm—Norman N. Spain

[57] ABSTRACT

In a method of applying a layer of photosensitive material to a semiconductor material wafer (3), the photosensitive material is applied in liquid form to the wafer and the wafer is then rotated in order to obtain the desired thickness of the layer. Photosensitive material (7) present at the edge (6) of the wafer (3) is removed by means of a jet of a liquid directed onto this edge to dissolve the photosensitive material, the jet being directed first to an area beyond the wafer of semiconductor material, where upon the jet of liquid is directed to the edge of the wafer and finally the jet of liquid is directed again to an area beyond the wafer and the supply of liquid is switched off.

3 Claims, 3 Drawing Figures

METHOD AND APPARATUS FOR APPLYING A LAYER OF PHOTOSENSITIVE MATERIAL TO A SEMICONDUCTOR WAFER

BACKGROUND OF THE INVENTION

The invention relates to a method of applying a layer of photosensitive material to a wafer of semiconductor material, in which photosensitive material is applied to the wafer in liquid form and the wafer is then rotated in order to obtain the desired thickness of the layer, photosensitive material present at an edge of the wafer being removed by means of a jet of a liquid directed onto this edge to dissolve the photosensitive material. The invention further relates to an apparatus for carrying out this method and to a semiconductor wafer obtained by means of this method.

In general, a photosensitive (photoresist) layer is applied to a semiconductor wafer for the manufacture of microelectronic circuits by means of machines particularly designed for this purpose. These machines comprise a rotatable horizontally arranged table the speed of which is variable. The semiconductor wafer is placed on this table and is held on it, for example, by means of a vacuum. A metered quantity of liquid photosensitive material is applied to the semiconductor wafer. By rotation of the table, the photosensitive layer is subjected to a centrifugal force and at a given speed of rotation the desired ultimate thickness of the photosensitive layer is attained.

In this process, however, an undesired effect occurs at the edge of the semiconductor wafer; at the edge the vertical part of the wafer is also covered with photosensitive material. This photosensitive material overhanging the edge is liable to break off as it is very brittle. Thus leads to an undesirable contamination both in the transport means and in the further processing apparatus of the semiconductor wafer, whereas an extremely high degree of purity is required in order to obtain a favorable yield.

In order to avoid this undesirable effect, the overhanging photosensitive material is removed by means of a suitable liquid organic solvent, such as, for example, acetone. A jet of the solvent is then directed onto the edge of the rotating semiconductor wafer. Due to spattering, a part of the active surface of the semiconductor wafer is often touched by the solvent, which adversely affects the yield.

SUMMARY OF THE INVENTION

The invention has for its object to provide a method in which the photosensitive material projecting beyond the edge of the semiconductor wafer is effectively removed, while the yield is not adversely affected. In order to achieve this object, the method according to the invention is characterized in that the jet of the liquid to dissolve the photosensitive material is directed first onto an area beyond the wafer of semiconductor material, in that the jet of liquid is then directed to the edge of the wafer and in that subsequently the jet of liquid is again directed onto an area beyond the wafer.

It is a surprise to find that by means of the method according to the invention, the undesirable spattering of the solvent on the photosensitive layer no longer occurs and that consequently the yield of suitable semiconductor units is greatly increased. The favorable effect of the method according to the invention is probably obtained because it is avoided that upon switching-on, the solvent is directed immediately onto the semiconductor wafer so that a spattering effect need not occur and the yield is considerably increased.

The invention further relates to an apparatus for carrying out the method according to the invention. Such an apparatus, which comprises a rotatable table and which further comprises means for holding a wafer of semiconductor material on the table and a supply device for a liquid suitable to dissolve photosensitive material, is characterized in that the supply device has a tubular part provided with an outlet nozzle for the liquid for dissolving the photosensitive material and in that the tubular part provided with the outlet nozzle is arranged so as to be laterally displaceable with respect to the rotatable table with the aid of means operating in such a manner that a jet of liquid emanating from the outlet nozzle is directed beyond the edge, then to the edge and subsequently again beyond the edge of the semiconductor wafer.

In a favorable embodiment of the apparatus according to the invention, the tubular part with the outlet nozzle is pivotably arranged and movement means are present to pivot the tubular part from the position in which the jet of liquid is directed beyond the edge of the semiconductor wafer, into a position in which the jet of liquid is directed to the edge, and then again beyond the edge.

DESCRIPTION OF THE PREFERRED EMBODIMENTS

Figure 1:
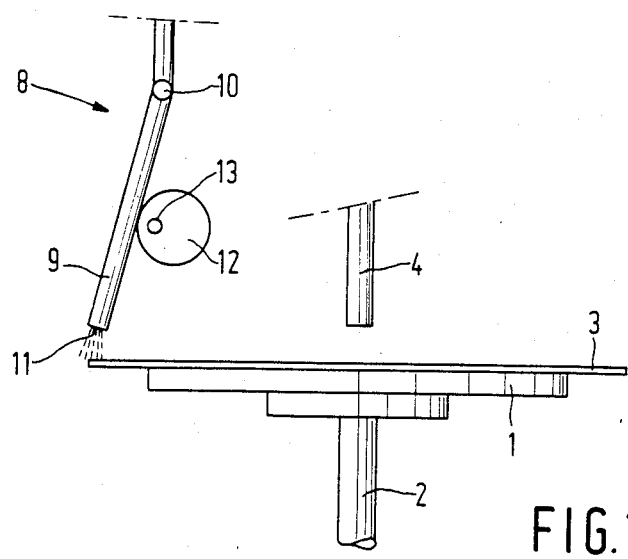
FIG. 1 is a diagrammatic view of an apparatus of the invention.

The invention will be described more fully with reference to an embodiment shown in the drawings.

Figure 2:
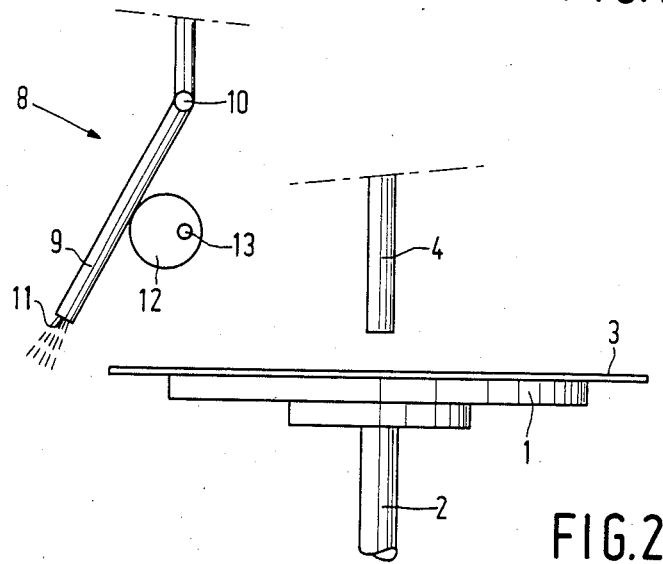
FIG. 2 is an additional diagrammatic view of an apparatus of the invention.
Figure 3:
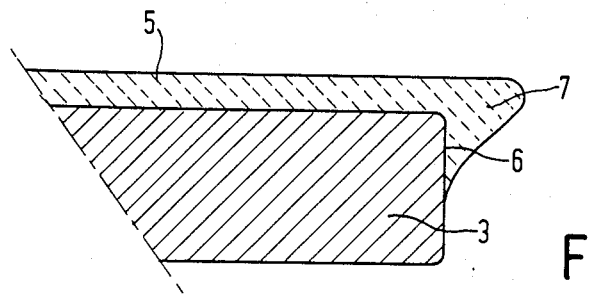
FIG. 3 is a cross-sectional view of a semiconductor wafer with photosensitive natural overhanging the edge thereof.

In the drawing:

FIG. 1 shows diagrammatically an apparatus for applying photosensitive material to a semiconductor wafer and for removing from a solvent supply device material overhanging the edge of the wafer, while FIG. 2 shows the same apparatus with the supply device for the solvent in a different position, FIG. 3 shows a part of a semiconductor wafer with photosensitive material overhanging the edge of the wafer.

FIGS. 1 and 2 show diagrammatically an apparatus for applying a layer of photosensitive material (photoresist) to a semiconductor wafer. As shown in FIGS. 1 and 2, the apparatus comprises a table 1, which is rotatable about a shaft 2, whose drive is not shown. A wafer 3 of semiconductor material is placed on the table 1. The wafer is held on the table 1 in a manner known per se, for example, by means of a vacuum not shown.

Through a tube 4, a metered quantity of photosensitive material in liquid form is applied to the semiconductor wafer 3. By rotation about the shaft 2, a centrifugal force is exerted on the photosensitive material; the thickness of the layer ultimately to be obtained is also determined by the speed at which the shaft 2 and hence also the wafer 3 rotates.

The ultimate shape of the layer of photosensitive material 5 is shown in FIG. 3 at a greatly enlarged size. Besides being present on the upper side of the wafer 3, a portion 7 of the photosensitive material is also present at the peripheral edge of the wafer 3 and at the vertical part 6 of the wafer. Because of its brittleness, the portion 7 of the photosensitive material is liable to break off during transport and during furter processing of the semiconductor wafer 3. Parts broken off contaminate further processing apparatus, which may have an extremely detrimental effect on the quality of the semiconductor devices to be manufactured.

It is known to spray an organic liquid, such as acetone, directly onto the peripheral edge 6 of the semiconductor wafer covered with photosensitive material in order to dissolve the photosensitive material 7 and thus to prevent contaminations.

The Applicant has found that it is almost certain that mainly when switching on the spray of the solvent, which is directed onto the semiconductor wafer, spatters of the solvent also touch a part of the semiconductor wafer away from the edge and then cause defects in the photosensitive layer, which leads to the yield of satisfactorily operating semiconductor devices being adversely affected. The invention prevents this detrimental effect.

FIGS. 1 and 2 show also diagrammatically a part of the supply device 8 for supplying the solvent of the photosensitive layer. This supply device comprises a tubular part 9, which is pivotable about a pivot 10. The tubular part 9 has an outlet nozzle 11. A mechanism for pivoting the tubular part 9 is, in the embodiment shown, an eccentric disk 12 which is rotatable about a shaft 13. By rotation of the eccentric disk 12, the tube 9 can move between the poisitions shown in FIG. 1 and FIG. 2.

According to the invention, when removing the peripheral edge 7 of photosensitive material, in the first instance the outlet nozzle 11 is brought into the position shown in FIG. 2 and in this position the supply of dissolving liquid is switched on and the jet of liquid does not touch the semiconductor wafer 3. When switching on the jet, spattering of liquid on the surface of the semiconductor wafer is thus avoided. After the jet of liquid has been switched on, the nozzle 11 of the tube 9 is directed to the edge of the wafer 3. In the embodiment shown, the tube 9 is pivotable about the pivot 10 and the pivotal movement is controlled by means of an eccentric disk 12, which is rotatable about a shaft 13. In the position shown in FIG. 1, the jet of liquid is directed onto the edge of the wafer 3. It has been found that spattering of liquid on the semiconductor wafer 3 does not occur, as a result of which a detrimental effect on the yield is avoided. After the part of the photosensitive material overhanging the edge of the wafer has been dissolved, the tube 9 is brought again into the position shown in FIG. 2 and the jet of liquid is switched off.

It will be appreciated that the movement of the nozzle 11 and the tube 9 relative to the wafer 3 may also be effected in a different manner; the pivotable tube and the drive by means of an eccentric disk are given only by way of example.

What is claimed is:

1. A method of applying a layer of photosensitive material to a wafer of semiconductor material, in which photosensitive material is applied to the wafer in liquid form and the wafer is then rotated in order to obtain the desired thickness of the layer, photosensitive material present at an edge of the wafer being removed by means of a jet of a liquid directed onto this edge to dissolve the photosensitive material characterized in that the jet of the liquid employed to dissolve the photosensitive material is directed first onto an area beyond the wafer of semiconductor material, in that the jet of liquid is then directed to the edge of the wafer and in that subsequently the jet of liquid is directed again onto an area beyond the wafer.

2. An apparatus for applying a layer of photosensitive material to a wafer of semiconductor material, which apparatus comprises a rotatable table, means for holding a wafer of semiconductor material on the table and a supply device for a liquid capable of dissolving photosensitive material, characterized in that said supply device comprises a tubular part provided with an outlet nozzle for the liquid capable of dissolving the photosensitive material and in that the tubular part with the outlet nozzle is arranged so as to be laterally displaceable with respect to the rotatable table and means for laterally displacing said tubular part in a manner such that a jet of liquid emanating from the outlet nozzle is directed beyond the edge, then to the edge and subequently again beyond the edge of said wafer of semiconductor material.

3. An apparatus as claimed in claim 2, characterized in that the tubular part provided with the outlet nozzle is pivotably arranged and in that means are included for pivoting the tubular part from the position in which the jet of liquid is directed beyond the edge of the semiconductor wafer, into a position in which the jet of liquid is directed to said edge and then again beyond said edge.

* * * * *